United States Patent
Tamura et al.

(10) Patent No.: US 9,291,404 B2
(45) Date of Patent: Mar. 22, 2016

(54) COOLER AND COOLING DEVICE

(71) Applicants: Masayoshi Tamura, Chiyoda-ku (JP); Seiji Haga, Chiyoda-ku (JP); Yosuke Kikuchi, Chiyoda-ku (JP)

(72) Inventors: Masayoshi Tamura, Chiyoda-ku (JP); Seiji Haga, Chiyoda-ku (JP); Yosuke Kikuchi, Chiyoda-ku (JP)

(73) Assignee: MITSUBISHI ELECTRIC CORPORATION, Chiyoda-Ku, Tokyo (JP)

( * ) Notice: Subject to any disclaimer, the term of this patent is extended or adjusted under 35 U.S.C. 154(b) by 349 days.

(21) Appl. No.: 13/748,779

(22) Filed: Jan. 24, 2013

(65) Prior Publication Data
US 2013/0220587 A1   Aug. 29, 2013

(30) Foreign Application Priority Data
Feb. 24, 2012   (JP) ................................ 2012-038094

(51) Int. Cl.
| F28F 3/12 | (2006.01) |
| F28F 3/02 | (2006.01) |
| F28F 3/08 | (2006.01) |

(52) U.S. Cl.
CPC . *F28F 3/02* (2013.01); *F28F 3/022* (2013.01); *F28F 3/12* (2013.01); *F28F 3/086* (2013.01); *H01L 2924/0002* (2013.01)

(58) Field of Classification Search
CPC ... F28F 3/022; F28F 2250/02; F28F 2215/00; F28F 1/124; F28F 13/00; F28F 3/02; F28F 3/12; F28F 3/086; H01L 23/3677; H01L 23/473; H01L 2924/00; H01L 2924/0002
USPC ............. 165/80.4, 80.3, 109.1; 361/703, 704, 361/709
See application file for complete search history.

(56) References Cited

U.S. PATENT DOCUMENTS

| 4,151,548 A * | 4/1979 | Klein et al. .................... 257/714 |
| 5,655,600 A * | 8/1997 | Dewar et al. ................... 165/166 |
| 6,039,114 A * | 3/2000 | Becker et al. .................. 165/170 |
| 6,729,383 B1 * | 5/2004 | Cannell et al. ............... 165/80.3 |
| 2004/0150956 A1 * | 8/2004 | Conte ............................ 361/709 |

(Continued)

FOREIGN PATENT DOCUMENTS

| DE | 40 17 749 A1 | 12/1991 |
| JP | 10-190265 A | 7/1998 |

(Continued)

OTHER PUBLICATIONS

Yoshihiro Kondo et al., "Experimental Study of Impingement Cooling of Heat Sinks for LSI Packages with Pin-Fin Arrays", Collection of Papers of Japan Society of Mechanical Engineers (Edition B) vol. 61, No. 582, Feb. 1995, pp. 339-345.

(Continued)

*Primary Examiner* — Tho V Duong
(74) *Attorney, Agent, or Firm* — Buchanan Ingersoll & Rooney PC

(57) ABSTRACT

The cooling device comprises a heat exchange unit provided in a cooling water flow path. The heat exchange unit has a plate part in the form of a plate and multiple fins erected on the plate face of the plate part, and provided in the manner that the plate face of the plate part extends along the cooling water flow path and the cooling water runs through the space between the fins. The multiple fins are each in the form of a rhombic column and provided on the plate part in a lattice pattern in the manner that the longer diagonal of the rhombic column extends along the cooling water flow path.

2 Claims, 13 Drawing Sheets

(56) References Cited

U.S. PATENT DOCUMENTS

| | | | |
|---|---|---|---|
| 2005/0126752 A1 | 6/2005 | Matsushima et al. | |
| 2008/0066888 A1* | 3/2008 | Tong et al. | 165/80.3 |
| 2011/0008198 A1* | 1/2011 | Hou | 419/6 |
| 2011/0315367 A1 | 12/2011 | Romero et al. | |

FOREIGN PATENT DOCUMENTS

| | | |
|---|---|---|
| JP | 11-204978 A | 7/1999 |
| JP | 2001-319998 A | 11/2001 |
| JP | 2006-324647 A | 11/2006 |
| JP | 2011-017516 A | 1/2011 |
| WO | 2010/136017 A1 | 12/2010 |

OTHER PUBLICATIONS

Office Action issued on Oct. 21, 2014, by the German Patent Office in corresponding German Patent Application No. 10 2013 101 747.9 and an English translation of the Office Action. (15 pages).

Office Action (Notification of First Office Action) issued on Feb. 13, 2015, by the Chinese Patent Office in corresponding Chinese Patent Application No. 201310056053.0, and a Partial English Language Translation. (14 pages).

Office Action issued by Japanese Patent Office on Oct. 6, 2015 in corresponding corresponding Japanese Application No. 2012-038094, and English language translation of Office Action (9 pages).

* cited by examiner

FIG.3
FIG.4
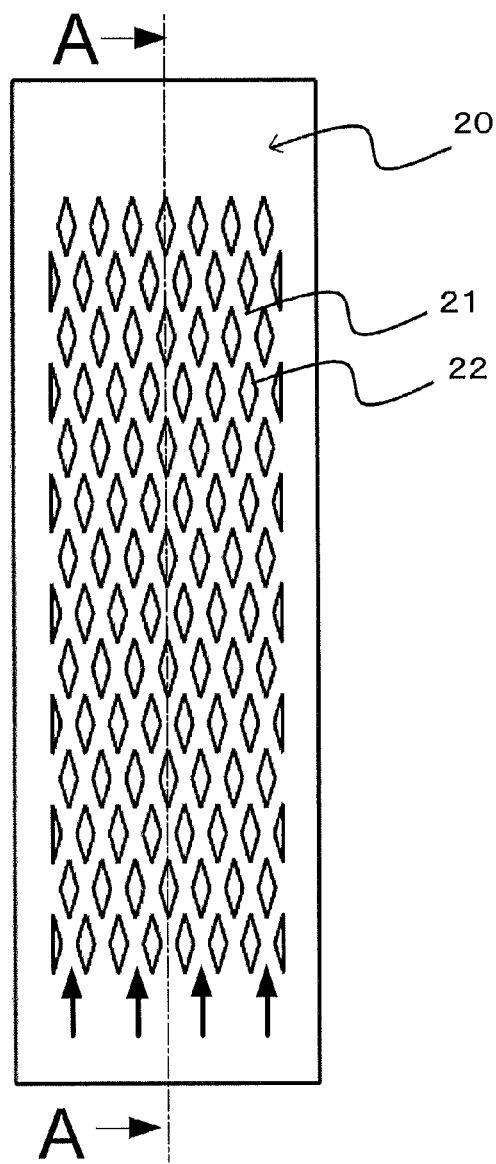
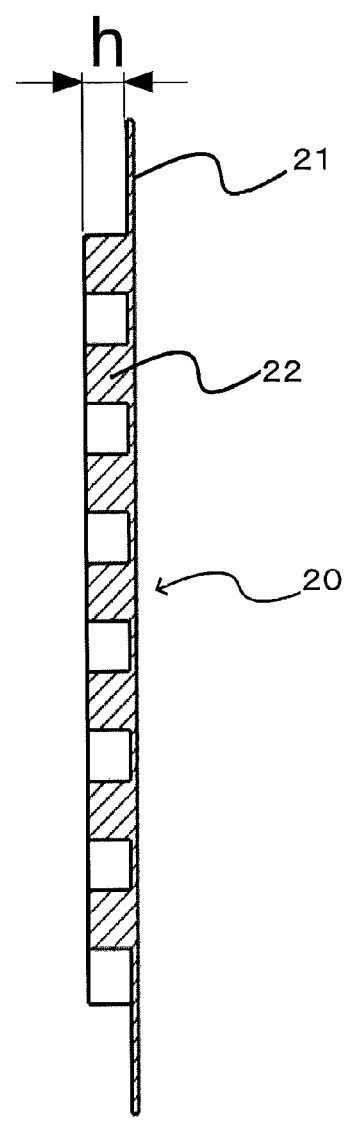

$0.270 \leqq b/a \leqq 0.325$ $0.270 \leqq b/a \leqq 0.325$

COOLER AND COOLING DEVICE

CROSS-REFERENCE TO RELATED APPLICATION

This application claims the benefit of Japanese Patent Application No. 2012-38094, filed on Feb. 24, 2012, the entire disclosure of which is incorporated by reference herein.

FIELD

This application relates to a cooler and cooling device.

BACKGROUND

Highly efficient cooling mechanisms for cooling objects such as electronic devices including CPUs, LSIs, and inverters and power semiconductors are known in the prior art. For example, Unexamined Japanese Patent Application Kokai Publication No. H10-190265 and Kondo et al. ("Experimental Review on Jet Cooling Property of Pin-Fin Heat Sink to be mounted in LSI Package," Collection of Papers of Japan Society of Mechanical Engineers (Edition B) Vol. 61, No. 582, pp. 339-345, February of 1995) disclose cooling mechanisms in which multiple cylindrical or rectangular-parallelepiped pin fins are erected on the plate face of a metal base to which a cooling object is thermally connected. Those cooling mechanisms apply cooling air to the pin fines for cooling the cooling object.

A cooling mechanism provided with multiple cylindrical or rectangular-parallelepiped pin fins can realize high cooling performance because of excellent heat transfer coefficients of the pin fines. However, when water or LLC is used as the cooling water circulating through the space between the pin fines, the cooling water is subject to significant pressure loss and a high power mechanism is required for pumping the cooling water.

The present invention is invented in view of the above circumstances and an exemplary object of the present invention is to provide a cooler with high heat exchange efficiency and low cooling water pressure loss and a cooling device using the cooler.

SUMMARY

In order to achieve the above object, the cooler of the present invention is a cooler provided in a cooling water flow path for heat exchange with the cooling water, comprises: a plate configured to have a plate face facing the cooling water; and fins coupled to the plate face in a lattice pattern and provided in the cooling water flow path, wherein the fins are in the form of a rhombic column with a longer diagonal of a rhombus of the rhombic column extending in the direction of the cooling water flow path.

The present invention can realize a cooler and cooling device with a high heat exchange efficiency and a low cooling water pressure loss.

BRIEF DESCRIPTION OF THE DRAWINGS

A more complete understanding of this application can be obtained when the following detailed description is considered in conjunction with the following drawings, in which:

FIG. 3 is a plane view showing the heat exchange unit according to Embodiment 1;

FIG. 4 is a cross-sectional view seen in the arrowed direction at A-A in FIG. 1;

DETAILED DESCRIPTION

Embodiments of the present invention will be described hereafter with reference to the drawings.

Embodiment 1

Figure 1:
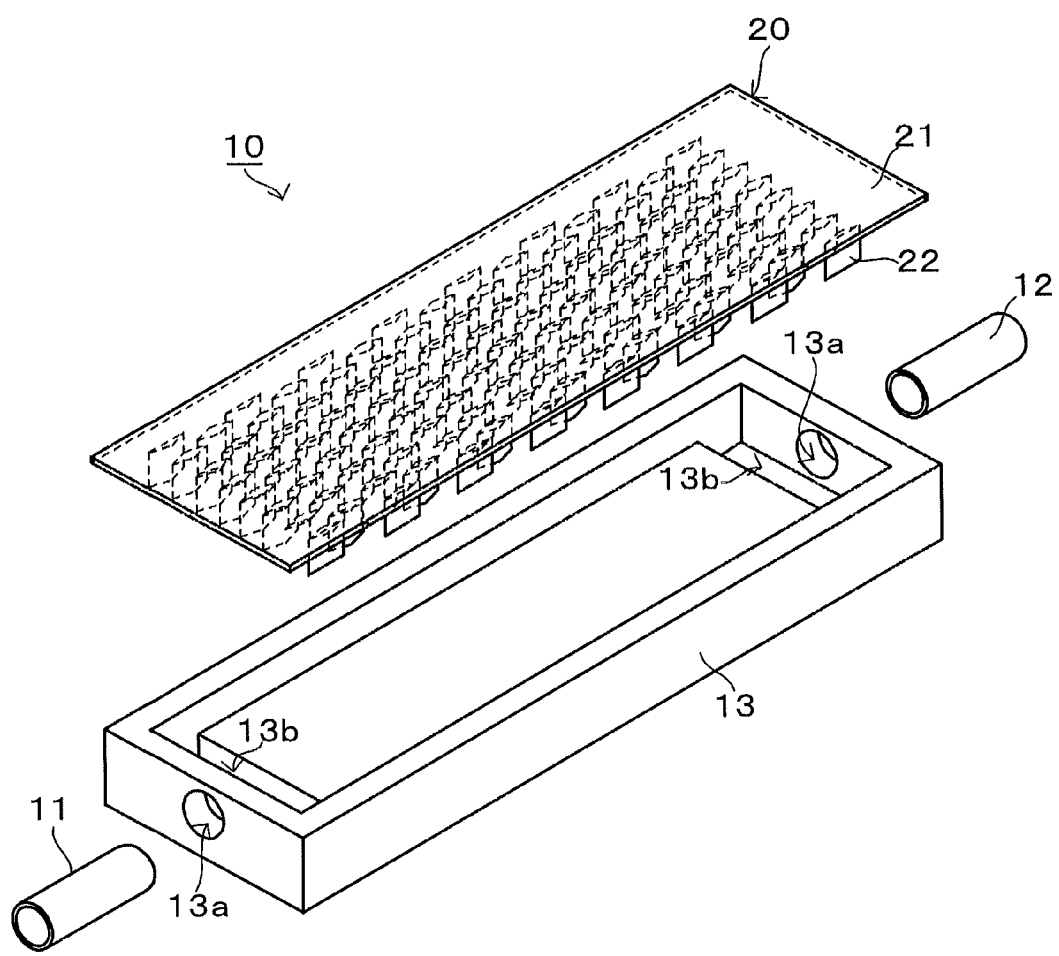
FIG. 1 is a perspective view showing the general structure of the cooling device according to Embodiment 1 of the present invention.

FIG. 1 is an illustration showing the general structure of a cooling device 10 according to Embodiment 1 of the present invention. The cooling device 10 according to Embodiment 1 of the present invention is used to cool a cooling object such as electronic devices including CPUs, LSIs, and inverters and power semiconductors. The cooling device 10 comprises, as shown in FIG. 1, a cooling water inlet 11 and outlet 12, a casing 13, and a heat exchange unit (cooler) 20. The cooling device 10 further comprises a not-shown cooling water pumping mechanism such as a pump driven by an electric motor. In the following explanation, the solid arrows in the figures indicate the flow of cooling water. Here, the cooling device 10 may use a cooling water pumping mechanism to circulate the cooling water. In such a case, a reservoir and/or filter can be provided in the flow path. For example, water, LLC, or alcohol can be selected as appropriate for use as the cooling water.

The inlet 11, outlet 12, and casing 13 are each made of a highly heat conductive material such as copper, aluminum, and iron, and constitute a part of the cooling water flow path. In this embodiment, the casing 13 is in the form of a rectangular parallelepiped box with a large opening face and has recesses 13b near holes 13a connected to the inlet 11 and to the outlet 12. The inlet 11 and outlet 12 are in the form of a pipe. The inlet 11, outlet 12, and casing 13 can be made as one piece by casting or as individual pieces bonded or welded together with an adhesive or solvent.

Figure 2:
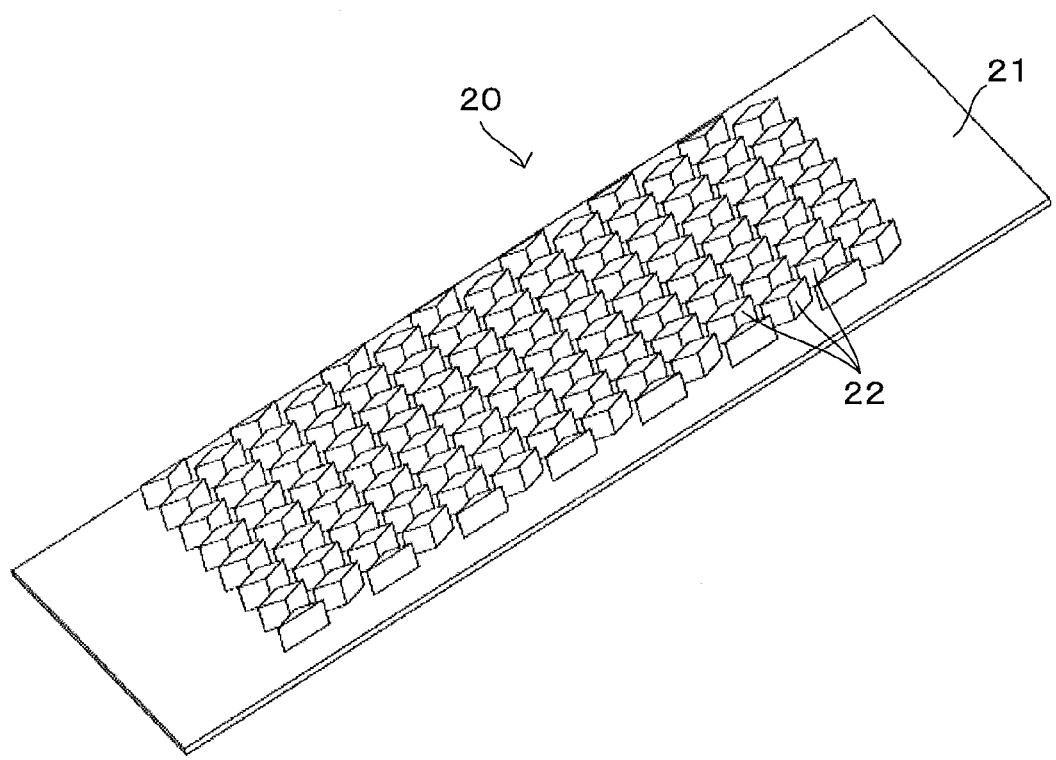
FIG. 2 is a perspective view showing the heat exchange unit according to Embodiment 1.

Like the casing 13 and so on, the heat exchange unit 20 is also made of a highly heat conductive material such as copper, aluminum, and iron, and attached to the opening face of the casing 13. The heat exchange unit 20 has, as shown in FIGS. 2 to 4, a plate part 21 in the form of a plate and multiple fins 22. Conforming with the opening face of the casing 13 in shape, the plate part 21 is attached to the opening face of the casing 13 by bonding with an adhesive or welding with a solvent. Consequently, the plate part 21 is provided with its plate face extending along the cooling water flow path and constitutes the cooling water flow path together with the casing 13, inlet 11, and outlet 12.

The multiple fins 22 are erected on the plate face of the plate part 21. The multiple fins 22 can be formed integrally with the plate part 21, for example, by die casting, or brazed or welded to the plate part 21. The multiple fins 22 are each in the form of a rhombic column having a rhombic cross-section in parallel to the plate face of the plate part 21. The multiple fins 22 are arranged on the plate part 21 in a two-dimensional lattice pattern in the direction along the cooling water flow path connecting the cooling water inlet 11 and outlet 12 and in the direction perpendicular thereto. The multiple fins 22 are each oriented so that the longer diagonal of the rhombus extends along the flow path direction. In this embodiment, the multiple fins 22 are arranged in a houndstooth check pattern on the plate face of the plate 21 in the matter that the distance t between their walls is nearly equal.

With the cooling device 10, a cooling object is attached to the surface opposite to the one on which the casing 13 and the multiple fins 22 of the heat exchange unit 20 are provided. With the cooling device 10, the cooling water flows in between the casing 13 and heat exchange unit 20 from the inlet 11, runs through the space between the multiple fins 22, and exits from the outlet 12. Then, with the cooling device 10, heat is transferred from the cooling object to the casing 13 and heat exchange unit 20, and while the cooling water passes between the casing 13 and heat exchange unit 20, the heat is radiated from the casing 13 and heat exchange unit 20 to the cooling water, whereby the cooling object is cooled. The heat exchange unit 20 of the cooling device 10 of this embodiment is constructed by erecting multiple rhombic column-shaped fins 22 in a lattice pattern, minimizing the pressure loss while the cooling water circulates through the space between the fins 22 and improving the heat transfer efficiency of the cooling device 10.

Figure 5:
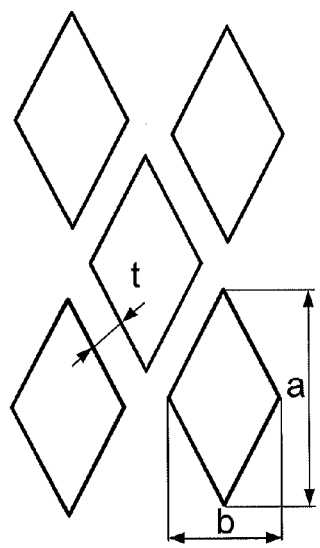
FIG. 5 is an enlarged view of the fins of the heat exchange unit according to Embodiment 1.
Figure 6:
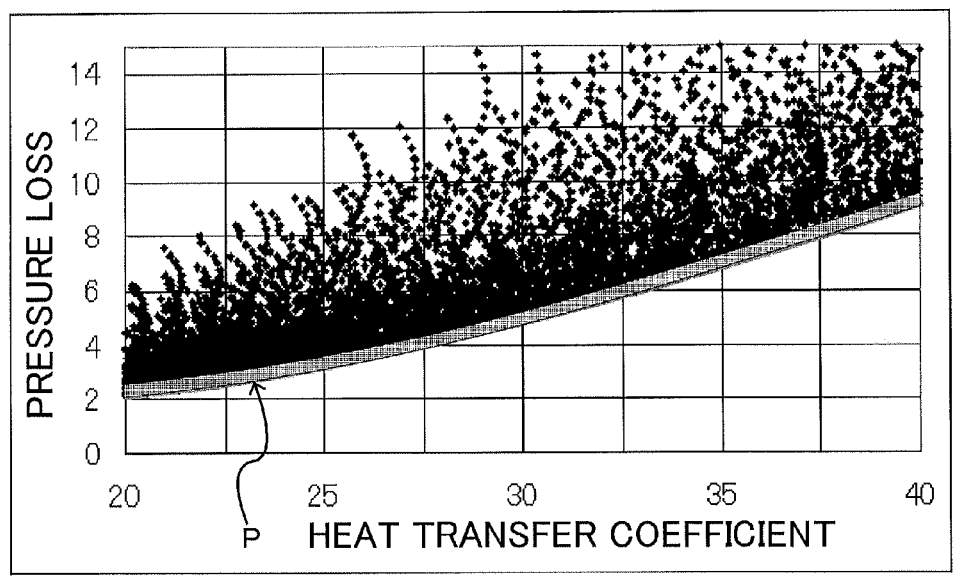
FIG. 6 is a graphical representation showing the pressure loss and heat transfer coefficient property when the heat exchange unit is changed in shape.

Particularly preferable shapes for the rhombic column-shaped fins 22 of the heat exchange unit 20 will be described hereafter. FIG. 5 is an illustration schematically showing some of the multiple fins 22 as seen from above. FIG. 6 is a graphical representation showing the pressure loss and heat transfer coefficient property of the cooling device 10 when the short/long ratio (b/a) of a rhombus of the rhombic column-shaped fins 22, the length a of the longer diagonal of a rhombus, and the spatial distance t between multiple fins 22 are changed. In FIG. 6, the short/long ratio (b/a) of a rhombic fin 22, the length a (mm) of the longer diagonal, and the spatial distance t (mm) are changed within the ranges given by the formulae (1) to (3) below, respectively, and the pressure loss and heat transfer coefficient property are obtained by three-dimensional fluid simulation. FIG. 6 shows by a solid line the Pareto solution P for the pressure loss and heat transfer coefficient property with respect to the shape and layout of the fins 22 (the short/long ratio (b/a), the length a of the longer diagonal, and spatial distance t). Here, the Pareto solution P is a solution that inevitably deteriorates one of the pressure loss and heat transfer coefficient properties by improving the other. The shape of the fins 22 yielding the Pareto solution P is the optimal shape for the pressure loss and heat transfer coefficient property.

$$0.15 \leq b/a \leq 0.45 \quad (1)$$

$$1.0 \leq a \leq S7.0 \quad (2)$$

$$0.6 \leq t \leq 2.0 \quad (3)$$

Figure 7:
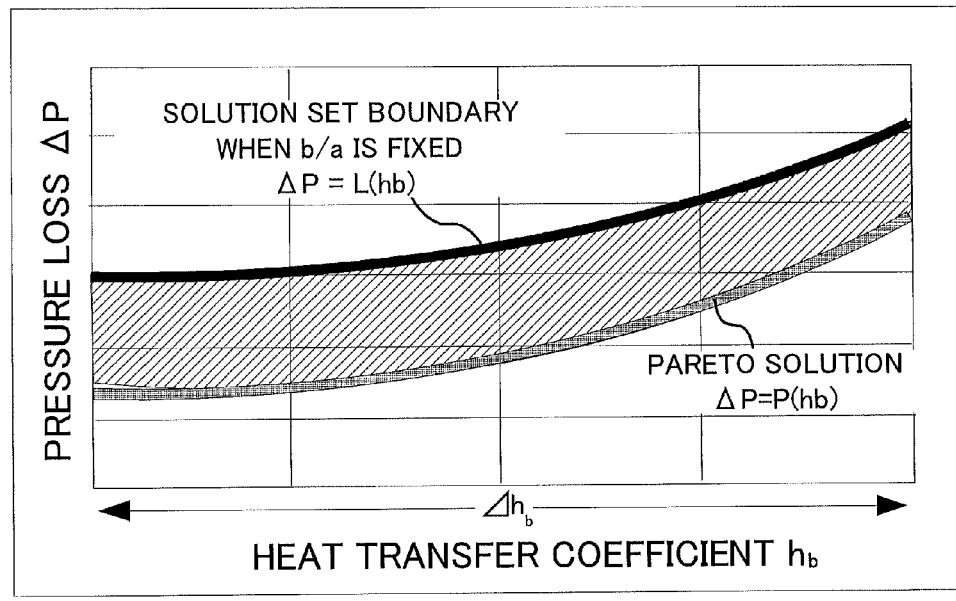
FIG. 7 is a graphical representation schematically showing the pressure loss and heat transfer coefficient property when the short/long ratio of a rhombic fin is fixed and the length of the longer diagonal of the rhombus and the spatial distance between fins are changed.

FIG. 7 is a graphical representation schematically showing the pressure loss and heat transfer coefficient property of the cooling device 10 when the short/long ratio (b/a) of a rhombic fin 22 is fixed in value (for example, fixed to any x (mm) satisfying $0.15 \leq x \leq 0.45$) and the length a of the longer diagonal and the spatial distance t are changed within the ranges satisfying the formulae (2) and (3) above. FIG. 7 also shows the boundary L of the calculated range of the pressure loss and heat transfer coefficient property when the short/long ratio (b/a) of a rhombic fin 22 is fixed and the Pareto solution P shown in FIG. 5. As the boundary L and Pareto solution P are closer, the pressure loss and heat transfer coefficient property of the fins 22 for that short/long ratio (b/a) are closer to the Pareto solution P and the short/long ratio (b/a) is preferable. Here, the Pareto optimal degree Op given by the formula (4) below is defined to indicate the closeness between the boundary L for any short/long ratio (b/a) and Pareto solution P. The Pareto optimal degree Op corresponds to the inverse of the area between the boundary L and Pareto solution P (the hatched part in FIG. 7) divided by the range Δhb of the heat transfer coefficient. As the Pareto optimal degree Op is greater, the boundary L for that short/long ratio (b/a) is closer to the Pareto solution P and the short/long ratio (b/a) leads to the fins 22 excellent in performance.

$$Op = \Delta hb / \int [L(hb) - P(hb)] dhb \quad (4)$$

Figure 8:
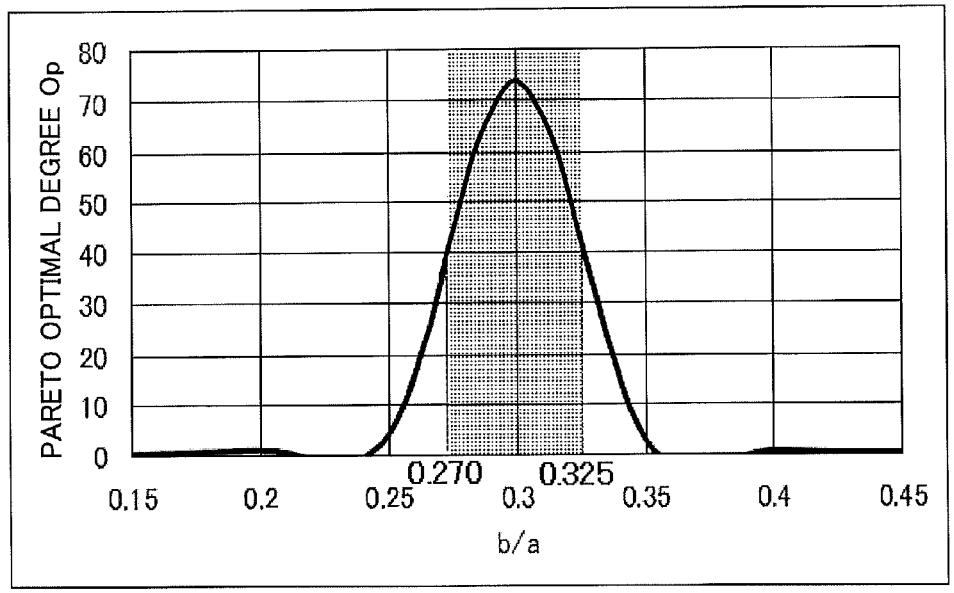
FIG. 8 is a graphical representation showing the Pareto optimal degree for each aspect ratio of a rhombic fin.

FIG. 8 is a graphical representation showing the relationship between the short/long ratio (b/a) of the fins 22 and Pareto optimal degree Op. As shown in the figure, the Pareto optimal degree Op has the maximum value near a short/long ratio (b/a) of 0.3. The calculation results of this embodiment revealed that the Pareto optimal degree Op is 40 or higher and the fins 22 are particularly excellent in performance when the short/long ratio (b/a) is $0.270 \leq b/a \leq 0.325$.

The above-described cooling device 10 has multiple fins 20 arranged in a houndstooth check pattern with a nearly equal spatial distance t. However, this is not restrictive. For example, the multiple fins 22 can be arranged in a lattice pattern in which they are placed at fixed intervals (including proximity) in the direction of the flow path connecting the cooling water inlet 11 and outlet 12 and in the direction perpendicular thereto.

Embodiment 2

Figure 9:
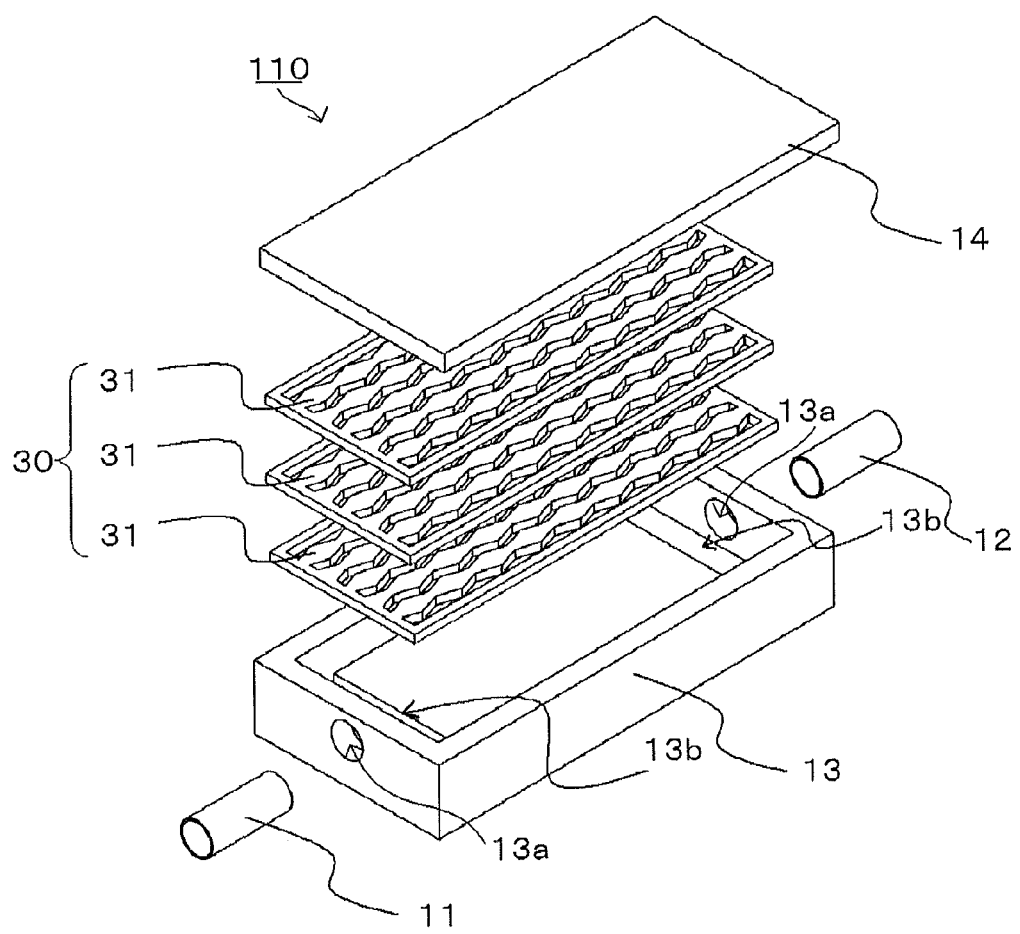
FIG. 9 is an illustration showing the general structure of the cooling device of Embodiment 2.
Figure 10:
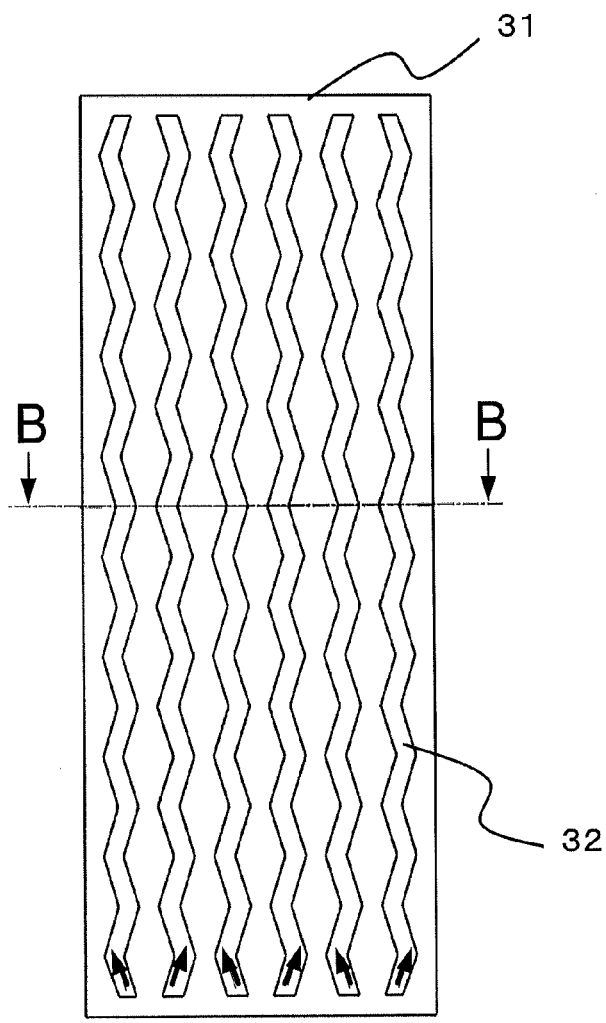
FIG. 10 is a plane view showing the stacked structure of the cooling device according to Embodiment 2.
Figure 11:
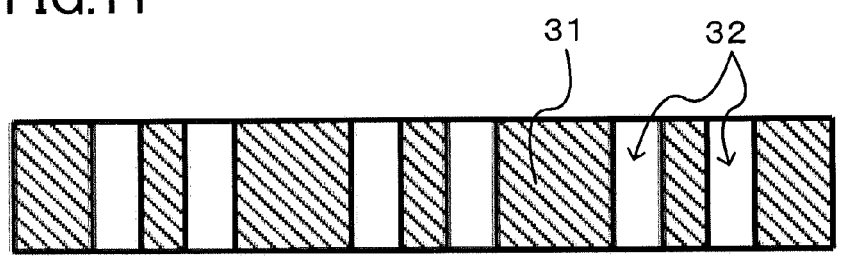
FIG. 11 is a cross-sectional view seen in the arrowed direction at B-B in FIG. 10.

FIG. 9 is an illustration showing the general structure of a cooling device 110 of Embodiment 2. The cooling device 110 comprises a stacked structure 30 in place of the heat exchange unit 20 in Embodiment 1. The stacked structure 30 is constructed by stacking multiple plates (heat exchange plates) 31. Inserted from the opening of the casing 13 and covered with a cover 14, the stacked structure 30 is placed in the cooling water flow path. Explanation of the same structure as in Embodiment 1 will be omitted hereafter.

The multiple plates 31 forming the stacked structure 30 are made of a highly heat conductive material such as copper, aluminum, and/or iron. The multiple plates 31 are each in the form of a plate with a rectangular plate face and have multiple serrated (zigzag) slits 32 formed through the thickness (in the stacking direction). The multiple serrated slits 32 are each elongated along the cooling water flow path direction or the direction connecting the cooling water inlet 11 and outlet 12, and are arranged in the direction perpendicular to the cooling water flow path direction. Furthermore, the multiple slits 32 are each in the form of a serration consisting of a successive angled pattern. Adjacent slits 32 are in opposite phases (shifted by 180 degrees). The multiple slits 32 of a plate 31 can be formed by, for example, press punching, laser cutting, or etching.

Figure 12:
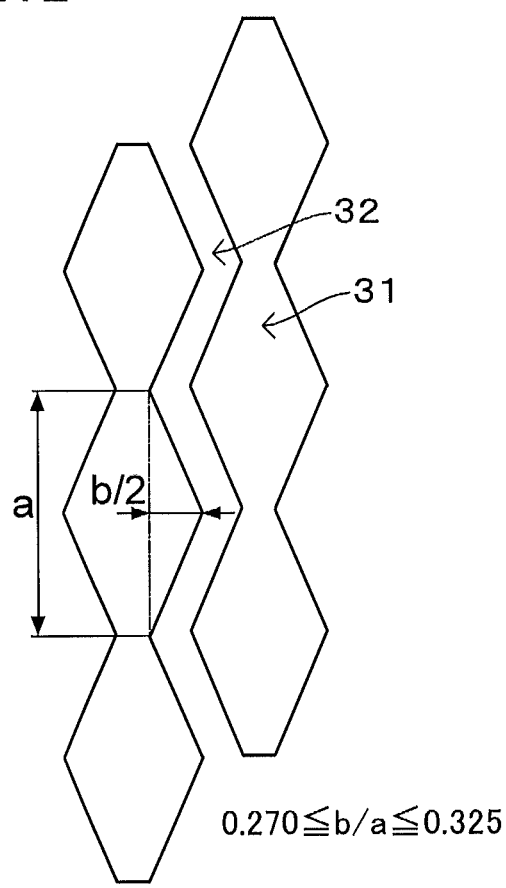
FIG. 12 is an enlarged view of a slit and the surrounding area of the plate.

In this embodiment, the multiple slits 32 have a pattern determined based on the rhombus described in Embodiment 1. The multiple slits 32 are, as shown in FIG. 12, in the form of serration consisting of a successive isosceles triangle pattern having a base a and height b' satisfying $0.270 \leq b'/(2 \cdot a) \leq 0.325$. In other words, the parts of the multiple plates 31 that separate adjacent slits 32 protrude to the right and left in an isosceles triangular pattern (on either side in the direction perpendicular to the cooling water flow path direction) and are similar in shape to the rhombus described in Embodiment 1 ($b'=b/2$).

Figure 13:
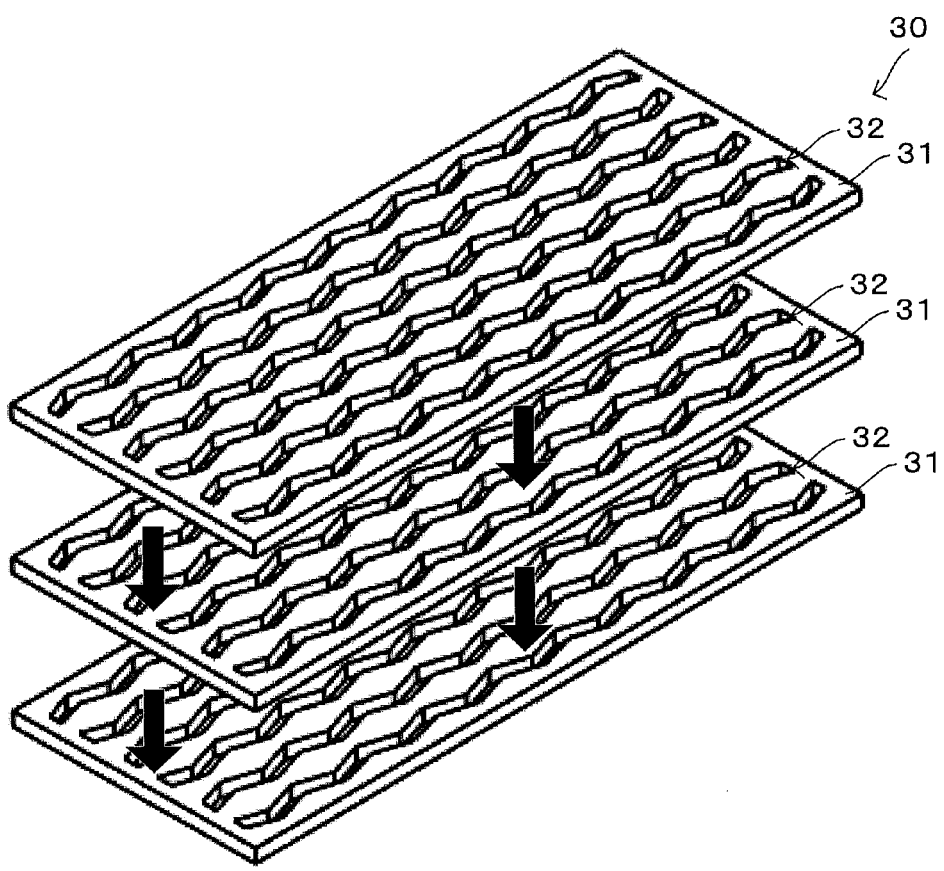
FIG. 13 is an illustration for explaining how to stack multiple plates to construct a stacked structure.

The multiple plates 31 are connected by brazing or welding in a watertight fashion so that the slits 32 of adjacent plates 31 communicate with each other to form a stacked structure 30 as shown in FIG. 13. Then, the stacked structure 30 is inserted in the casing 13 and covered with the cover 14 to construct the cooling device 110. In this embodiment, as described above, the casing 13 has the recesses 13b near the holes 13a connected to the inlet 11 and to the outlet 12. The recesses 13b are widened in the stacking direction of the stacked structure 30. With the cooling device 110, as the cooling water enters the casing 13 from the inlet 11, the cooling water flows in perpendicularly to the plate faces of the plates 31 of the stacked structure 30 via the recess 13b. Then, the cooling water runs toward the outlet 12 through the multiple slits 32 formed in the plates 31, and exits perpendicularly to the plate faces of the plates 31 via the recess 13b near the outlet 12.

In the above-described cooling device 110 of Embodiment 2, the slits 32 of the plates 31 forming the stacked structure 30 are serrated in the manner such that adjacent slits 32 are in opposite phases and the parts of the plates 31 that separate adjacent slits 32 protrude in an isosceles triangle pattern to create a shape similar to the rhombus described in Embodiment 1, thereby reducing the cooling water pressure loss and improving the heat transfer efficiency of the cooling device. Furthermore, if the slits 32 are slightly shifted from each other in the plate face direction in making them communicate while stacking the plates 31, the increased area in which the cooling water and stacked structure 30 make contact and/or the stirred cooling water can improve the heat exchange efficiency. Furthermore, if the slits 32 are shifted in the cooling water flow path direction, the cooling water can easily flow in the slits 32 for example even if the casing 13 is not provided with the recesses 13b.

Embodiment 3

Figure 14:
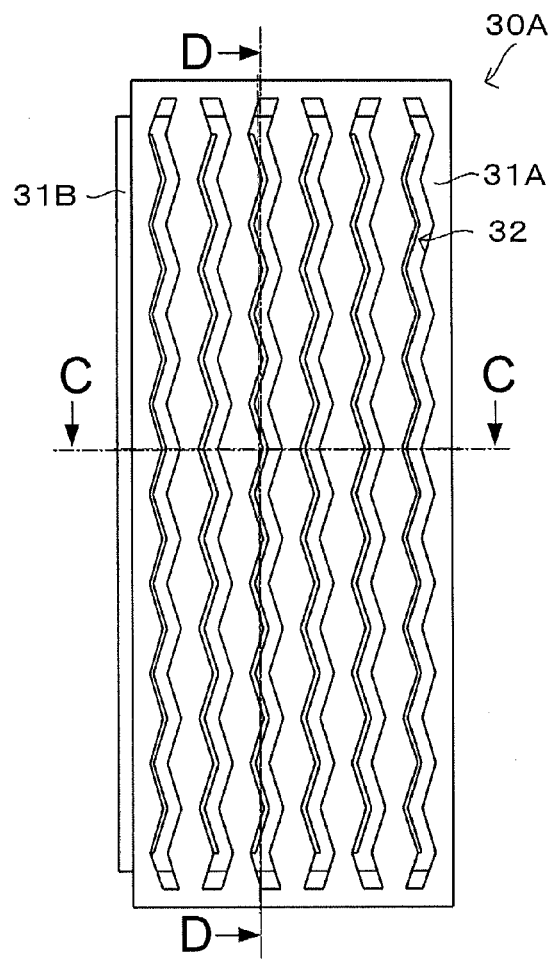
FIG. 14 is an illustration showing the general structure of the stacked structure according to Embodiment 3.
Figure 15:
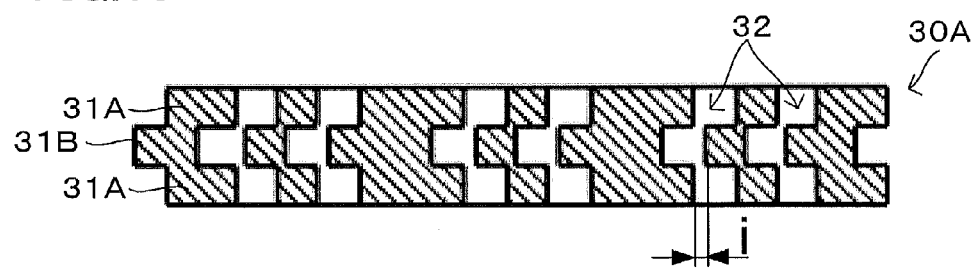
FIG. 15 is a cross-sectional view seen in the arrowed direction at C-C in FIG. 14.
Figure 16:
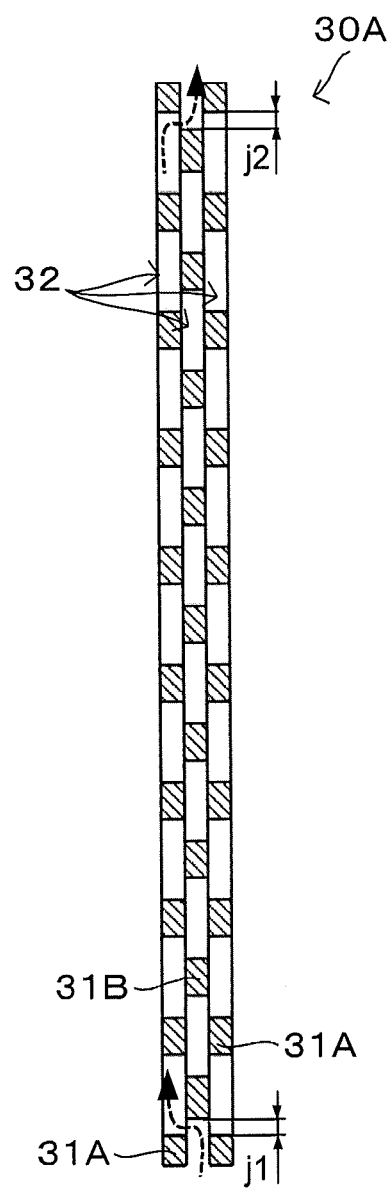
FIG. 16 is a cross-sectional view seen in the arrowed direction at D-D in FIG. 14.

FIG. 14 is a plane view of a stacked structure 30A of Embodiment 3. FIGS. 15 and 16 are cross-sectional views seen in the arrowed directions at CC and DD in FIG. 14, respectively. In Embodiment 3, the plates 31 having multiple serrated slits 32 are stacked to construct the stacked structure 30A as in Embodiment 2. However, the plates 31 to be stacked include long plates 31A and short plates 31B having the long and short slits 32 in the cooling water flow path direction. As shown in FIGS. 14 to 16, the stacked structure 30A can be constructed with the slits 32 shifted so as to increase the area in which the cooling water and stacked structure 30A make contact and move the cooling water in the stacking direction to improve the heat exchange efficiency of the cooling device. Here, the above effects are more easily obtained by shifting the slits 32 more. However, as the space through which the slits 32 communicate with each other becomes smaller, foreign substances entering the stacked structure 30A, if any, cannot be discharged from the stacked structure 30A as shown by the broken line arrows in FIG. 16. For example, of the shift in the cooling water flow path direction (denoted by j1 in FIG. 16) and the shift in the direction perpendicular thereto (denoted by i in FIG. 15), if the latter is smaller than the former, larger foreign substances entering through the gap j1 cannot run through the gap i (the foreign substances cannot move in the stacking direction). On the other hand, in this Embodiment 3, as shown in FIG. 16, the plates 31A and plate 31B having the long and short slits 32 in the cooling water flow path direction are alternately stacked to ensure that the space to discharge foreign substances is provided near the outlet 12 (the gap j2>j1 in FIG. 16), thereby preventing foreign substances from being stuck.

Embodiment 4

Figure 17:
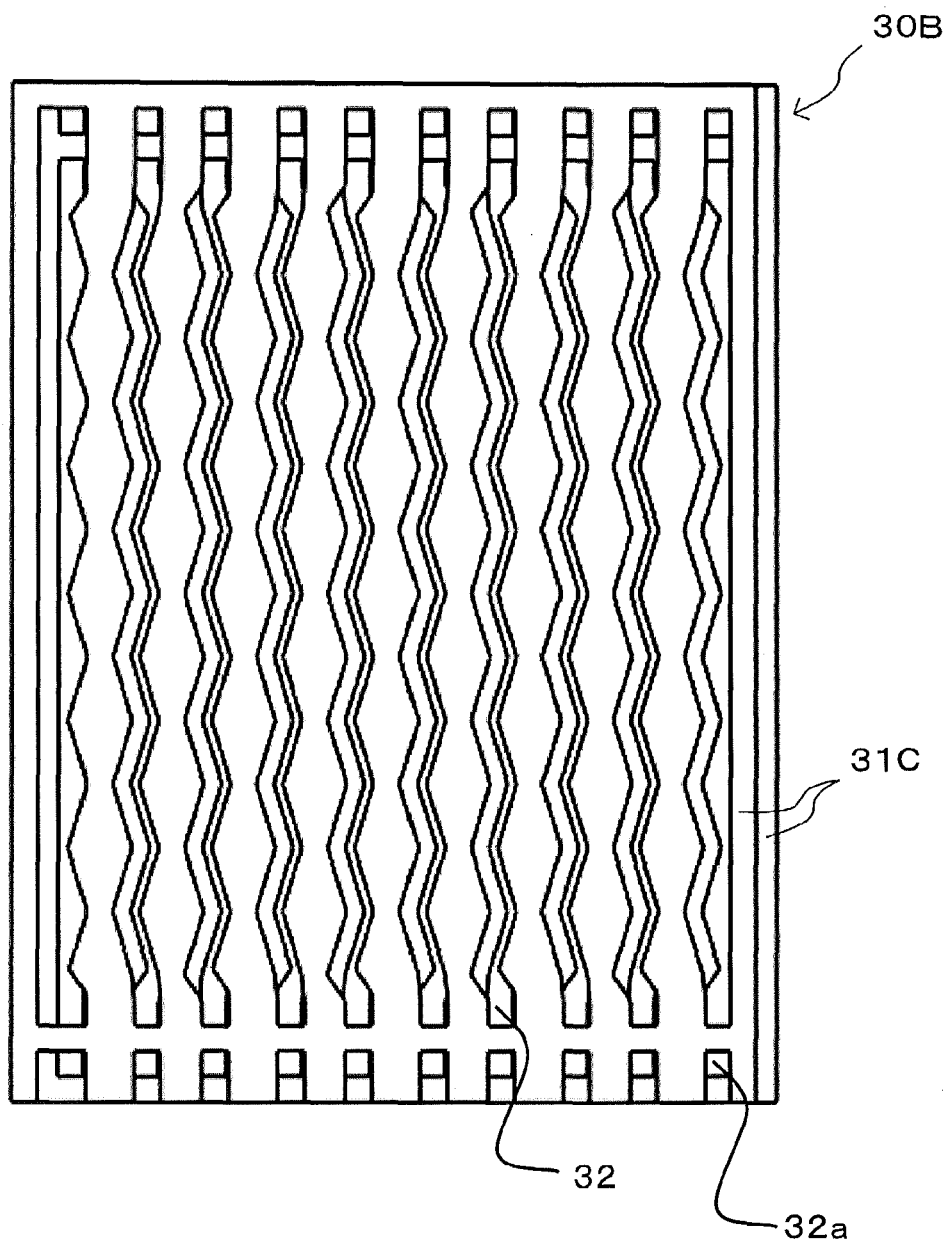
FIG. 17 is an illustration showing the general structure of the stacked structure according to Embodiment 4.
Figure 18:
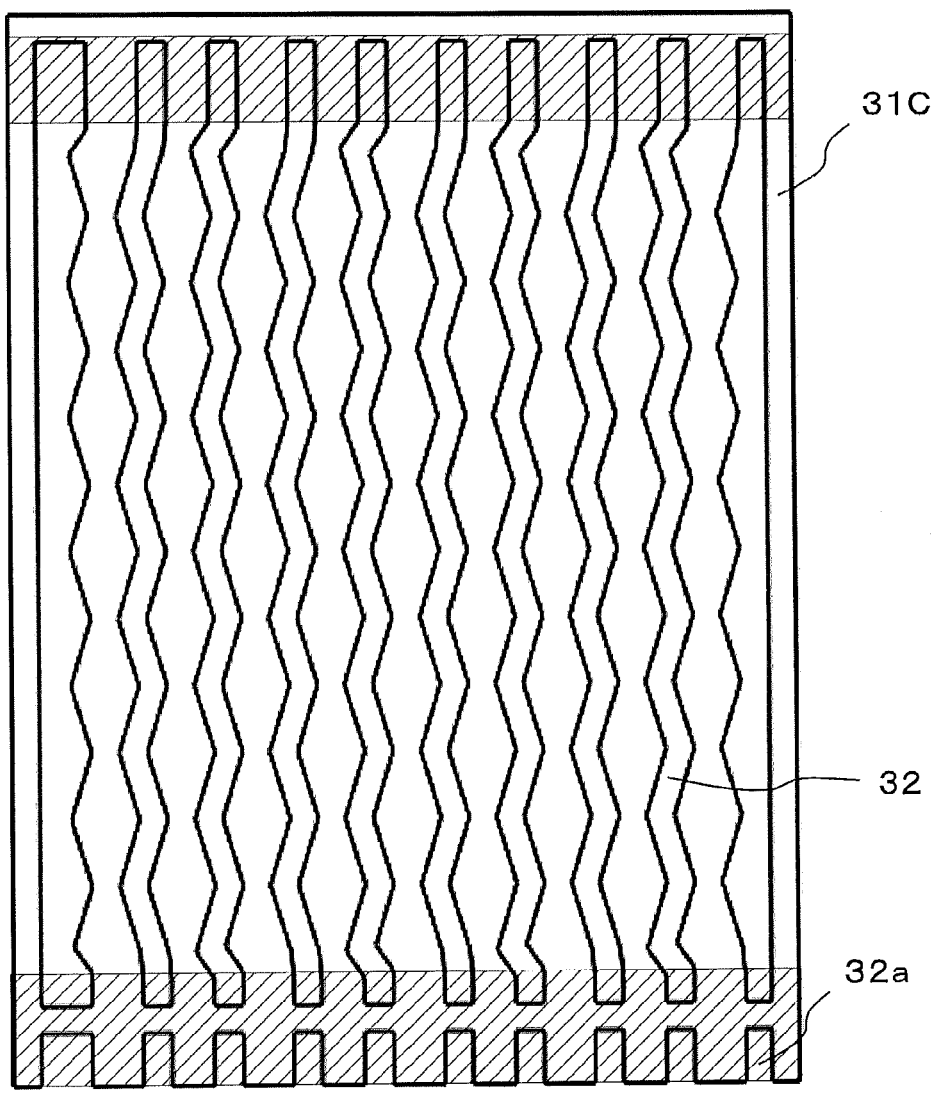
FIG. 18 is an illustration showing a plate of the stacked structure according to Embodiment 4.

FIG. 17 is a plane view of a stacked structure 30B of Embodiment 4. FIG. 18 is a plane view of a plate 31C of Embodiment 4. The stacked structure 30B of Embodiment 4 is constructed by stacking multiple plates 31C of one kind with every other plate rotated by 180°. The plates 31C of this embodiment have slits 32 parallel in specific areas near the cooling water inlet 11 and outlet 12 (the hatched areas in FIG. 18). Such parallel slits 32 allow the slits 32 to communicate with each other with no shift after the plates 31C are rotated by 180°. Furthermore, the parallel slits 32 end with a notch 32a either near the inlet or near the outlet. In this way, there is no interfere with the cooling water flowing to the inlet 11 or to the outlet 12 and the cooling water is urged to move between the plates 31C, improving the heat transfer efficiency. Furthermore, proper positioning of the plate part separating the notches 32a and slits 32 ensures the space to discharge foreign substances and prevents the foreign substances from being stuck as in the stacked structure 30A of Embodiment 3.

Embodiments of the present invention are described above. The present invention is not confined to the above-described embodiments and various modifications and applications are available. For example, the casing 13 is in the form of a rectangular parallelepiped. However, any shape can be utilized, for example, the region near the inlet 11 or outlet 12 can radially be enlarged from the inlet 11 or radially be reduced toward the outlet 12.

In the above-described Embodiments 2 to 4, the stacked structure 30 is housed with the cover 14 covering it. With a cover plate replacing the cover 14 being stacked on the end face, the stacked structure 30 can be attached to the casing 13 without using the cover 14.

Embodiments of the present invention are described above. The present invention is not confined to the embodiments and includes any mode obtained by adding various changes to the embodiments and the technical scope equivalent thereto.

Having described and illustrated the principles of this application by reference to one or more preferred embodiments, it should be apparent that the preferred embodiments may be modified in arrangement and detail without departing from the principles disclosed herein and that it is intended that the application be construed as including all such modifications and variations insofar as they come within the spirit and scope of the subject matter disclosed herein.

10 Cooling device
11 Inlet
12 Outlet
13 Casing
14 Cover
20 Heat exchange unit
21 Plate part
22 Fin
30, 30A, 30B Stacked structure
31, 31A, 31B, 31C Plate
32 Slit

What is claimed is:

1. A cooler provided in a cooling water flow path for heat exchange with cooling water, comprising:
    a plate configured to have a plate face facing the cooling water; and
    fins coupled to the plate face in a lattice pattern and provided in the cooling water flow path,
    wherein the fins are in the form of a rhombic column with a longer diagonal of a rhombus of the rhombic column extending in the direction of the cooling water flow path, and
    the fins satisfy $0.270 \leq b/a \leq 0.325$ in which a (mm) is a length of the longer diagonal of the rhombus of the rhombic column and b (mm) is a length of a shorter diagonal of the rhombus.

2. The cooler according to claim 1, wherein the fins satisfy $1.0 \leq a \leq 7.0$ and $0.6 \leq t \leq 2.0$ in which a (mm) is the length of the longer diagonal of the rhombus of the rhombic column and t (mm) is a spatial distance between the fins.

* * * * *

UNITED STATES PATENT AND TRADEMARK OFFICE
CERTIFICATE OF CORRECTION

PATENT NO.       : 9,291,404 B2
APPLICATION NO.  : 13/748779
DATED            : March 22, 2016
INVENTOR(S)      : Masayoshi Tamura et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 356 days.

Signed and Sealed this
Fifth Day of July, 2016

Michelle K. Lee
*Director of the United States Patent and Trademark Office*